(12) United States Patent
Shin et al.

(10) Patent No.: US 7,645,556 B2
(45) Date of Patent: Jan. 12, 2010

(54) COMPOSITION FOR FORMING ORGANIC INSULATING FILM AND METHOD FOR FORMING PATTERN OF ORGANIC INSULATING FILM USING THE SAME

(75) Inventors: Jung Han Shin, Gyeonggi-do (KR); Tae Woo Lee, Seoul (KR); Bon Won Koo, Gyeonggi-do (KR); Bang Lin Lee, Gyeonggi-do (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 531 days.

(21) Appl. No.: 11/156,489

(22) Filed: Jun. 21, 2005

(65) Prior Publication Data

US 2006/0006380 A1 Jan. 12, 2006

(30) Foreign Application Priority Data

Jun. 21, 2004 (KR) ............... 10-2004-0046177
Jun. 2, 2005 (KR) ............... 10-2005-0047107

(51) Int. Cl.
G03F 7/00 (2006.01)
G03F 7/004 (2006.01)

(52) U.S. Cl. .......... 430/270.1; 430/281.1; 257/40

(58) Field of Classification Search ......... 470/270.1, 470/281.1; 257/40, 295; 428/447
See application file for complete search history.

(56) References Cited

U.S. PATENT DOCUMENTS 5,946,551 A 8/1999 Dimitrakopoulos et al.
6,232,157 B1 5/2001 Dodabalapur et al.
2002/0055059 A1* 5/2002 Nishimura et al. ....... 430/270.1
2003/0193624 A1* 10/2003 Kobayashi et al. ............ 349/42
2005/0279995 A1* 12/2005 Shin et al. ..................... 257/40

OTHER PUBLICATIONS

Marcus Halik, et al., "High-mobility organic thin-film transistors based on α,α'-didecyloigothiophenes", Applied Physics Letters, vol. 93, No. 5, Mar. 1, 2003, pp. 2977-2981.
Marcus Halik, et al., "Fully patterned all-organic thin film transistors", Applied Physics Letters, vol. 81, No. 2, Jul. 8, 2002, pp. 289-291.
CH. Pannemann, et al., "Nanometer scale organic thin film transistors with Pentacene", Microelectronic Engineering, 67-68 (2003) pp. 845-852.
S. Chou, et al., "Nanoimprint lithography", J. Vac. Sci. Technol. B vol. 14, No. 6, Nov./Dec. 1996, pp. 4129-4133.

* cited by examiner

*Primary Examiner*—Amanda C. Walke
(74) *Attorney, Agent, or Firm*—Harness, Dickey & Pierce, P.L.C.

(57) ABSTRACT

A photo-patternable composition for forming an organic insulating film which includes (i) a functional group-containing monomer, (ii) an initiator generating an acid or a radical upon light irradiation, and (iii) an organic or inorganic polymer. Further disclosed is a method for forming a pattern of an organic insulating film using the composition. Since an organic insulating film can be simply patterned without involving any photoresist process, the overall procedure is simplified and eventually an organic thin film transistor with high charge carrier mobility can be fabricated by all wet processes.

19 Claims, 4 Drawing Sheets

COMPOSITION FOR FORMING ORGANIC INSULATING FILM AND METHOD FOR FORMING PATTERN OF ORGANIC INSULATING FILM USING THE SAME

BACKGROUND OF THE INVENTION

This non-provisional application claims priority under 35 U.S.C. §119(a) on Korean Patent Application No. 2004-46177 filed on Jun. 21, 2004, which is herein expressly incorporated by reference, and on Korean Patent Application No. 2005-47107 filed on Jun. 2, 2005, which is herein expressly incorporated by reference.

1. Field of the Invention

The embodiments of the present invention relate to a composition for forming an organic insulating film and a method for forming a pattern of an organic insulating film using the composition. More particularly, the embodiments of the present invention relate to a photo-patternable composition for forming an organic insulating film which comprises: (i) a functional group-containing monomer; (ii) an initiator generating an acid or a radical upon light irradiation; and (iii) an organic or inorganic polymer, and a method for forming a pattern of an organic insulating film using the composition.

2. Description of the Related Art

Since polyacetylenes as conjugated organic polymers exhibiting semiconductor characteristics were developed, organic semiconductors have been actively investigated as novel electrical and electronic materials in a wide variety of applications, e.g., functional electronic and optical devices and various synthetic processes, because of easy molding into fibers and films, superior flexibility, high conductivity and low manufacturing costs.

Among devices fabricated using these electrically conductive polymers, research on organic thin film transistors fabricated using organic materials as semiconductor active layers has been conducted since the 1980's. In this connection, a number of studies are now being actively undertaken around the world. Organic thin film transistors are substantially identical to silicon (Si) thin film transistors in terms of their structure, but have a great difference in that organic materials are used as semiconductor materials instead of silicon. In addition, such organic thin film transistors have advantages in that they can be fabricated by printing processes at ambient pressure, and further by roll-to-roll processes using plastic substrates, instead of conventional silicon processes, such as plasma-enhanced chemical vapor deposition (CVD), making organic thin film transistors economically advantageous over silicon thin film transistors.

Organic thin film transistors are expected to be useful for driving devices of active displays and plastic chips for use in smart cards and inventory tags, and are comparable to α-Si thin film transistors in terms of their performance. The performance of organic thin film transistors is dependent on the degree of crystallization of organic active layers, charge characteristics at the interfaces between substrates and organic active layers, carrier injection ability into the interfaces between source/drain electrodes and organic active layers.

There have been a number of trials to improve the performance of organic thin film transistors. Particularly, in an attempt to decrease a threshold voltage, insulators having a high dielectric constant, for example, ferroelectric insulators, such as $Ba_xSr_{1-x}TiO_3$ (barium strontium titanate (BST)), $Ta_2O_5$, $Y_2O_3$, $TiO_2$, etc., and inorganic insulators, such as $PbZr_xTi_{1-x}O_3$ (PZT), $Bi_4Ti_3O_{12}$, $BaMgF_4$, $SrBi_2(Ta_{1-x}NB_x)_2O_9$, $Ba(Zr_{1-x}Ti_x)O_3$ (BZT), $BaTiO_3$, $SrTiO_3$, $Bi_4Ti_3O_{12}$, etc., have been used as materials for inorganic insulating films (U.S. Pat. No. 5,946,551). However, these inorganic oxide materials do not have a significant advantage over conventional silicon materials in terms of processing.

As materials for organic insulating films, polyimide, benzocyclobutene (BCB), photoacryl, and the like have been used (U.S. Pat. No. 6,232,157). However, since these organic insulating films exhibit unsatisfactory device characteristics over inorganic insulating films, they are unsuitable to replace inorganic insulating films.

In addition, Infineon Technology attempted to improve the chemical resistance of an organic insulating film in a subsequent process by mixing polyvinylphenol (PVP) with poly-melamine-co-formaldehyde. However, this attempt is limited in its application to plastic substrates since a temperature as high as 200° C. is required to crosslink the PVP (Journal of Applied Physics 2003, 93, 2977 & Journal of Applied Physics 2002, 81, 289).

On the other hand, in order to apply organic thin film transistors to the display devices, it is necessary to form patterns of organic insulating films for the interconnection of electrodes. Photolithography has typically been employed to form patterns of organic insulating films. For photolithography, organic insulating films must satisfy the following additional requirements. That is, the organic insulating films must be compatible with photoresists. In addition, the organic insulating films must have superior thermal resistance and etch resistance to the photoresists so as not to be influenced by heating and etching during photolithography. Furthermore, the organic insulating films must have sufficient chemical resistance against a photoresist stripper to avoid the influence of the stripper when being exposed.

In the choice of suitable compositions for forming organic insulating films, the above-mentioned requirements should be taken into consideration. Accordingly, the compositions are very limited in their use. The choice of unsuitable compositions inevitably causes poor electrical properties and makes the fabrication of organic thin film transistors by all wet processes difficult. Thus, there exists a need in the art for a method for forming a pattern of an organic insulating film in a simple manner without the use of a photoresist.

In this connection, J. Vac. Sci. Technol. B, Vol. 14, No. 6, November/December 1996 describes a method for transferring a pattern by coating a resist on a substrate, imprinting the resist by molding, demolding, and removing the remaining resist by etching. However, this method has the limitation that it is not applicable to organic thin film transistors.

Microelectronic Engineering, 67-68 (2003), 845-852 discloses a method for forming a pattern of source/drain electrodes by forming a $SiO_2$ insulating film on a Si substrate, forming metal electrodes on the insulating film by deposition, coating a polymethylmethacrylate (PMMA) resist on the electrodes, followed by molding and etching. However, the application of this method is limited to patterns of source/drain electrodes.

SUMMARY OF THE INVENTION

Therefore, embodiments of the present invention has been made in view of the above problems of the prior art, and it is an object of the embodiments of the present invention to provide a method for forming a pattern of an organic insulating film with resistance to organic solvents used in subsequent processes in a simple manner without involving any photoresist process, thereby simplifying the overall procedure and eventually enabling fabrication of an organic thin film transistor with high charge carrier mobility by all wet processes.

In accordance with one aspect of the embodiments of the present invention, there is provided a composition for forming an organic insulating film, comprising:

(i) a functional group-containing monomer, the monomer being a compound containing at least one epoxide group selected from those represented by the following Formula 1:

Formula 1 or a compound containing at least one radical-polymerizable group selected from those represented by the following Formula 2:

Formula 2 wherein

R is hydrogen or methyl;

(ii) an initiator generating an acid or a radical upon light irradiation; and (iii) an organic or inorganic polymer.

In accordance with another aspect of the embodiments of the present invention, there is provided a method for forming a pattern of an organic insulating film by forming an electrode on a substrate, coating the composition thereon to form an organic insulating film, followed by light exposure and development.

In accordance with yet another aspect of the embodiments of the present invention there is provided an organic thin film transistor comprising an organic insulating film patterned by the method.

BRIEF DESCRIPTION OF THE DRAWINGS

The above and other objects, features and other advantages of the embodiments of the present invention will be more clearly understood from the following detailed description taken in conjunction with the accompanying drawings, in which.

DESCRIPTION OF THE PREFERRED EMBODIMENTS

The embodiments of the present invention will now be described in more detail with reference to the accompanying drawings.

The functional group-containing monomer used in the composition of embodiments of the present invention is a compound containing at least one epoxide group selected from those represented by the following Formula 1:

(1)

or a compound at least one radical-polymerizable group selected from those represented by the following Formula 2:

(2)

-continued wherein
R is hydrogen or methyl.

Specific examples of compounds containing at least one epoxide group include ethylene glycol diglycidyl ether, 1,4-butanediol diglycidyl ether, 1,4-cyclohexanedimethanol diglycidyl ether, bisphenol A diglycidyl ether, glycerol diglycidyl ether, glycerol propoxylate triglycidyl ether, triphenylolmethane triglycidyl ether, 4-vinylcylcohexane dioxide, dicyclopentadiene diepoxide, diglycidyl ether, 1,3-bis(3-glycidoxypropyl)tetramethyidisiloxane, 1,2-cyclohexanedicarboxylic acid diglycidyl ester, 1,4-bis(glycidyloxy)benzene, trimethylolpropane triglycidyl ether, 3,7,14-tris[[3-(epoxypropoxy)propyl]dimethylsilyloxy]-1,3,5,7,9,11,14-heptacyclopentyltricyclo[7,3,3,15,11]heptasiloxane, N,N-diglycidylaniline, 9,9-bis[4-(glycidyloxy)phenyl]fluorene, triglycidyl isocyanurate, bis[4-(2,3-epoxy-propylthio)phenyl]sulfide), resorcinol diglycidyl ether, 2,6-di(oxiran-2-ylmethyl)-1,2,3,5,6,7-hexahydropyrrolo[3,4,F]isoindole-1,3, 5,7-tetraone, santolink XI-100, 1,2,7,8-diepoxyoctane, 1-methyl-4-(1-methylepoxyethyl)-7-oxabicyclo[4,1,0]heptane, 3,4-epoxycyclohexylmethyl-3,4-epoxycyclohexylcarboxylate, glycidyl acrylate, glycidyl methacrylate, 4,4'-methylenebis(N,N-diglycidylaniline), bis(3,4-epoxycyclohexlmethyl)adipate, 1,2-epoxy-4-vinylcyclohexane, and 2-(3,4-epoxycyclohexyl)ethyltrimethoxysilane.

Specific examples of compounds containing at least one radical-polymerizable group include methyl (meth)acrylate, allyl (meth)acrylate, (meth)acrylic acid, 2-hydroxyethyl (meth)acrylate, glycidyl acrylate, bisphenol A dimethacrylate, 2-(dimethylamino)ethyl (meth)acrylate, ethylene glycol di(meth)acrylate, trimethylolpropane tri(meth)acrylate, n-butyl (meth)acrylate, stearyl (meth)acrylate, 1,6-hexanediol di(meth)acrylate, pentaerythritol triacrylate, 2,2,2-trifluoroethyl (meth)acrylate, 2-cyanoethyl acrylate, diethylene glycol di(meth)acrylate, 2-bromoethyl acrylate, D,L-menthyl (meth)acrylate, 1H,1H-perfluorooctyl (meth)acrylate, 1,1,1,3,3,3-hexafluoroisopropyl (meth)acrylate, 1,4-cyclohexanedimethyl 1,4-di(meth)acrylate, barium methacrylate, zinc methacrylate, methallyl methacrylate, cinnamyl (meth)acrylate, acryloxy tri-N-butyltin, methacryloxypropylmethyl dichlorosilane, trimethylsilyl (meth)acrylate, 2-(methacryloxyl)ethyl acetoacetate, 1,3-bis(3-methacryloxypropyl)tetramethyldisiloxane, 3-methacrylpropyltris(vinyldimethylsiloxy)silane, vinyl acrylate, vinyl acetate, vinyl chloroformate, vinyl trifluoroacetate, 2-chloroethyl vinyl ether, 1,6-hexanediol divinyl ether, di(ethylene glycol) vinyl ether, 2-ethylhexanoic acid vinyl ester, styrene, α-methyl styrene, 4-bromostyrene, 4-acetoxystyrene, 4-methoxystyrene, 2-vinylnaphthalene, 2,3,4,5,6-pentafluorostyrene, 3,4-dimethoxy-1-vinylbenzene, 4-vinylbiphenyl, N-vinyl-2-pyrrolidone, and N-vinylcarbazole.

The method of the embodiments of the present invention is characterized in that the functional group-containing monomer is mixed with the initiator generating an acid or a radical upon UV irradiation, followed by UV irradiation, to induce ring-opening or initiate polymerization of the monomer, thereby forming a crosslinked structure.

Examples of acid-generating initiators that can be used in embodiments of the present invention include: ionic photoacid generators, including sulfonium- and iodonium-based materials, e.g., triphenylsulfonium trifluoromethanesulfonate, triphenylsulfonium perfluorooctanesulfonate, diphenyl-p-tolylsulfonium perfluorooctanesulfonate, tris(p-tolyl)sulfonium perfluorooctanesulfonate, tris(p-chlorobenzene)sulfonium trifluoromethanesulfonate, tris(p-tolyl)sulfonium trifluoromethanesulfonate, trimethylsulfonium trifluoromethanesulfonate, dimethylphenylsulfonium trifluoromethanesulfonate, dimethyltolylsulfonium trifluoromethanesulfonate, dimethyltolylsulfonium perfluorooctanesulfonate, triphenylsulfonium p-toluenesulfonate, triphenylsulfonium methanesulfonate, triphenylsulfonium butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyltolylsulfonium 1,3,4-trichlorobenzenesulfonate, dimethyltolylsulfonium p-toluenesulfonate, diphenyltolylsulfonium 2,5-dichlorobenzenesulfonate, triphenylsulfonium chloride, triphenylsulfonium bromide, triphenylsulfonium tetrafluoroborate, triphenylsulfonium pentafluoroantimonate, triphenylsulfonium pentafluorophosphate, triphenylsulfonium pentafluoroarsenate, diphenyliodonium trifluoromethanesulfonate, bis(4-t-butylphenyl)iodonium 1,1,1,3,3,3-hexafluoro-2-trifluoromethylpropane-2-sulfonate, bis(4-t-butylphenyl)iodonium (7,7-dimethyl-6-oxo-bicyclo[2.2.1]heptyl)-methanesulfonate, and bis(4-t-butylphenyl)iodonium p-toluenesulfonate; non-ionic photoacid generators, including nitrobenzylsulfonate derivatives, imidosulfonate derivatives and azonaphthoquinone derivatives, e.g., 2-nitrobenzyl p-toluenesulfonate, 2,6-dinitrobenzyl p-toluenesulfonate, p-nitrobenzyl 9,10-dimethoxyanthracene-2-sulfonate, norbornene imidosulfonate, cyclohexyl tosylate, diazobismethanesulfonylbenzene, and bis(cyclohexyl)diazomethane; and polymeric photoacid generators having a weight-average molecular weight of 500-100,000 and containing a sulfonium or iodonium salt in their backbone or side chain or an organic photoacid generating group in their side chain.

Examples of radical-generating initiators that can be used in embodiments of the present invention include common organic peroxide and azo compounds. Specific examples include benzoyl peroxide, lauroyl peroxide, t-butyl hydroperoxide, acetylcyclohexanesulfonyl peroxide, isobutyroyl peroxide, di(2-ethylhexyl)peroxydicarboxylate, diisopropyl peroxydicarboxylate, t-butyl peroxypivalate, decanoyl peroxide, and azobis(2-methylpropionitrile).

Other examples of radicalgenerating initiators that can be used in the embodiments of the present invention include alpha-hydroxyketones, alpha-aminoketones, benzyldimethyl ketals, benzoin, benzoin methyl ether, benzoin ethyl ether, benzoin n-propyl ether, benzoin isopropyl ether, benzoin n-butyl ether, benzophenone, paramethyl benzophenone, acetophenone, anthraquinone, phenyl disulfide, and 2-nitrofluorene. Also, photosensitizers, such as tertiary amines, alkylphosphines and thioethers, can be additionally used.

The content of the initiator in the composition according to the embodiments of the present invention is preferably in the range of 0.1-10 parts by weight, based on 100 parts by weight of the functional group-containing monomer, but is not limited to this range. When the initiator is used in an amount exceeding 10 parts by weight, a problem may arise in that the crosslinked mixture may be gelled. On the other hand, when the initiator is used in an amount below 0.1 parts by weight, the degree of crosslinking may be low, deteriorating the solvent resistance of the thin film.

The organic or inorganic polymer used in the composition of the embodiments of the present invention is one preferably having a molecular weight of between 1,000 and 1,000,000, and is selected from the group consisting of polyvinylphenols and their derivatives, polyvinylalcohols and their derivatives, polyacryls and their derivatives, polynorbornenes and their derivatives, polyethyleneglycol derivatives, polypropyleneglycol derivatives, polysiloxane derivatives, cellulose derivatives, and copolymers thereof. Preferred are polymers containing a polar group, such as a hydroxyl or carboxyl group, in their backbone or side chain.

Further, the organic or inorganic polymer containing a polar group, e.g., hydroxyl or carboxyl, may be protected with an acid-labile protecting group, which is then deprotected by the initiator to be transformed back into the polar group. Examples of the acid-labile protecting group include t-butyl, isobornyl, menthyl, 2-methyl-2-adamantanyl, 2-ethyl-2-adamantanyl, tetracyclodecanyl, tetrahydropyranoyl, 3-oxocyclohexanoyl, mevalonic lactonyl, dicyclopropylmethyl, methylcyclopropylmethyl, methyl ethyl ether, and other groups.

The content of the organic or inorganic polymer in the composition of the embodiments of the present invention is preferably in the range of from 1 part to 10,000 parts by weight, based on 100 parts by weight of the functional group-containing monomer. If the organic or inorganic polymer is used in an amount of more than 10,000 parts by weight, there are potential dangers of a low degree of crosslinking and poor electrical properties. Meanwhile, if the organic or inorganic polymer is used in an amount of less than 1 part by weight, formation of the thin film is difficult and thus effective electrical properties may be unattainable.

An organic insulating film is formed by coating the composition of the embodiments of the present invention on a substrate on which a gate electrode is formed or by coating the composition on an organic active layer on which source-drain electrodes are formed. The coating may be carried out by spin coating, spin casting, dip coating, spray coating, roll coating, ink-jet printing, etc.

Additionally, a solvent capable of dissolving the composition of the embodiments of the present invention may be used in such a way that the thin film has a sufficient thickness after coating. The solvent can be used in an amount of 1% to 80% by weight, based on the total weight of the composition. Suitable organic solvents include, for example, cyclohexanone, chloroform, chlorobenzene, ethylene glycol monomethyl ether, propylene glycol methyl ether acetate, ethyl lactate, toluene, xylene, methyl ethyl ketone, 4-heptanone, methanol, butanol, acetone, N-methylformamide, N-methylpyrrolidone, triphenylimidazole, mesitylene, tetraline, and decaline.

The embodiments of the present invention also provide a method for forming a pattern of an organic insulating film using said composition.

Figure 1:
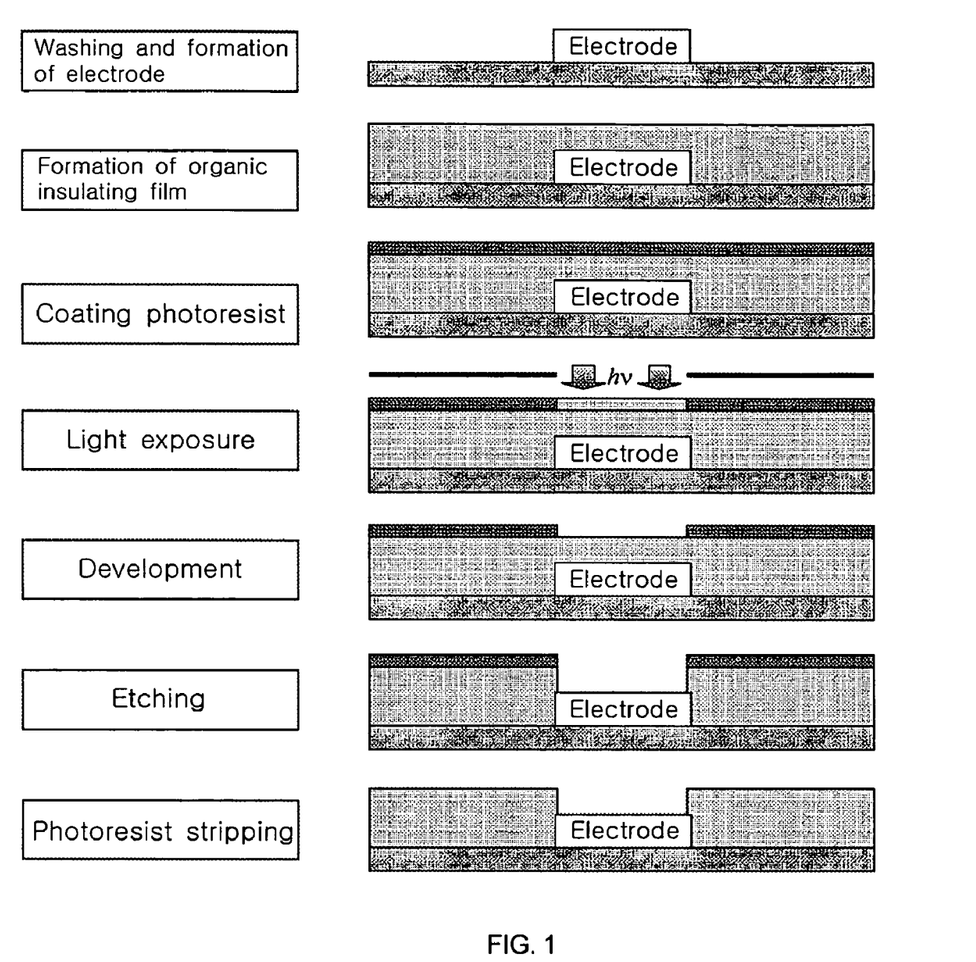
FIG. 1 is a schematic diagrammatic representation illustrating the steps of a conventional method for forming a pattern of an organic insulating film on an electrode for connection to a driving circuit.

FIG. 1 is a schematic diagrammatic representation illustrating the steps of a conventional method for forming a pattern of an organic insulating film by photolithography. Based on the respective steps, first, an electrode is formed on a previously washed substrate, and then an organic insulating film is formed thereon. Thereafter, a photoresist is coated on the organic insulating film, and is then developed to expose a region where a pattern is formed through a photomask by light exposure. After the underlying organic insulating film is dry- or wet-etched using the patterned photoresist as a shadow mask, the photoresist is removed using a photoresist stripper to complete the formation of a pattern of an organic insulating film.

The method of embodiments of the present invention is characterized in that a pattern of an organic insulating film is formed using the photo-patternable composition of embodiments of the present invention in a simple manner by light exposure and development.

Figure 2:
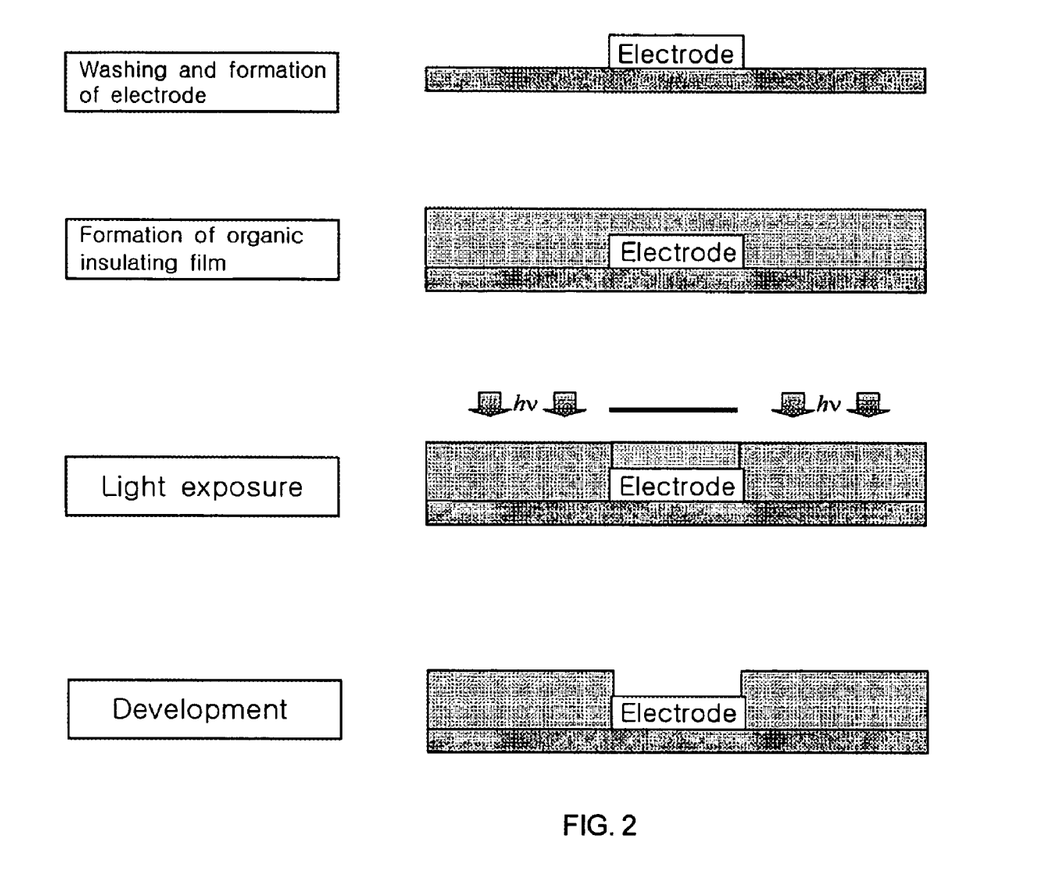
FIG. 2 is a schematic diagrammatic representation illustrating the steps of a method for forming a pattern of an organic insulating film on an electrode for connection to a driving circuit according to one embodiment of the present invention.

FIG. 2 is a schematic diagrammatic representation illustrating the steps of a method for forming a pattern of an organic insulating film according to embodiments of the present invention. The method of embodiments of the present invention comprises the steps of: i) forming an electrode on a previously washed substrate; ii) coating the composition of embodiments of the present invention thereon to form an organic insulating film; and iii) exposing the organic insulating film to light through a photomask, followed by development with an organic developing solution.

Hereinafter, the method of embodiments of the present invention will be explained in more detail based on the respective steps.

Step (i): Formation of Electrode

A substrate is washed to remove impurities by common processes, and then an electrode is formed thereon by deposition, patterning, or printing.

Step (ii): Formation of Organic Insulating Film

In this step, the composition of embodiments of the present invention is coated on the structure of step (i) to form an organic insulating film. Specifically, the composition of embodiments of the present invention is dissolved in an appropriate solvent, coated to a thickness of 2,000 Å to 20,000 Å, and soft-baked at 80 to 150° C. for 10 seconds-30 minutes, preferably at 100° C. for 5 minutes.

Step (iii): Formation of Pattern

In this step, the organic insulating film is exposed to UV light through a photomask having a desired shape, and developed using an organic developing solution to remove an unexposed region of the film, thereby forming a pattern.

Specifically, the light exposure is carried out by irradiating the surface of the organic insulating film with UV light at an exposure dose of 1 to 400 $mJ/cm^2$ in a UV exposure system. Next, the exposed organic insulating film is hard-baked at 80-150° C. for 1-120 minutes.

After completion of the hard baking, the unexposed region is removed using an organic developing solution. So long as the object of the embodiments of the present invention is not impaired, any developing solution that has been used in the art can be used, and for example, DMF, 4-hydroxy-4-methyl-2-pentanone, ethylene glycol monoethyl ether, 1-methyl-2-pyrrolidone, 2-methoxyethanol, and mixed solutions thereof are preferably used in terms of coating stability and uniformity of the pattern.

After the patterned organic insulating film is formed, an organic semiconductor layer and electrodes are formed thereon by common techniques to fabricate an organic thin film transistor.

Figure 3:
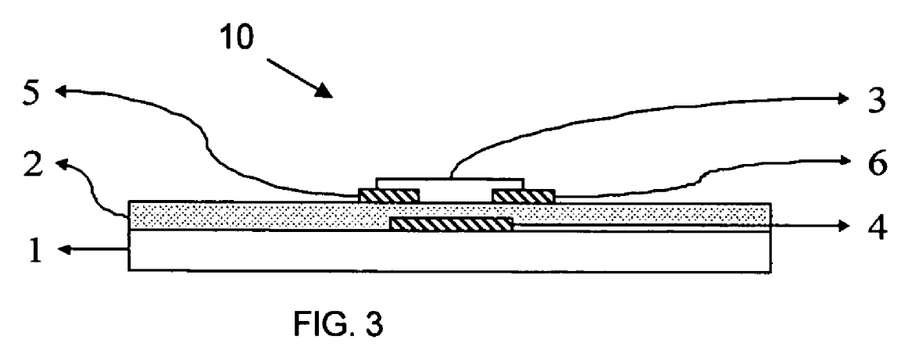
FIG. 3 is a cross-sectional view schematically showing the structure of an organic thin film transistor fabricated according to one embodiment of the present invention.

FIG. 3 is a cross-sectional view schematically showing the structure of an organic thin film transistor 10 fabricated according to one embodiment of the present invention. Referring to FIG. 3, a gate electrode 4 is formed on a substrate 1, the photo-patternable composition of embodiments of the present invention is coated thereon to form an organic insulating film 2, source/drain electrodes 5, 6 are formed on the organic insulating film 2, and finally a semiconductor layer 3 is formed thereon. However, the organic thin film transistor of embodiments of the present invention is not limited to this structure. For example, the formation order of the gate electrode 4, the organic insulating film 2, the semiconductor layer 3 and the source/drain electrodes 5,6 may be changed.

The substrate can be made of, without limitation, glass, silicon, plastic, etc.

Examples of suitable materials for the organic semiconductor layer of the organic thin film transistor according to embodiments of the present invention include, but are not limited to, pentacenes, copper phthalocyanines, polythiophenes, polyanilines, polyacetylenes, polypyrroles, polyphenylene vinylenes, and derivatives thereof.

Suitable materials for the gate electrode, the source electrode and the drain electrode are metals or electrically conductive polymers commonly used in the art, and their specific examples include, but are not limited to, gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures.

The organic thin film transistor of embodiments of the present invention can be utilized in the manufacture of display devices, such as electroluminescence devices, liquid crystal devices, and electronic ink devices.

The embodiments of the present invention will now be described in more detail with reference to the following examples. However, these examples are given for the purpose of illustration and are not to be construed as limiting the scope of the invention.

PREPARATIVE EXAMPLE 1

Preparation of Composition for Forming Organic Insulating Film Using Monomer Containing Epoxide Group as Functional Group 2.0 g of trimethylolpropane triglycidyl ether (Aldrich), 0.02 g of triphenylsulfonium triflate (Aldrich), 0.02 g of benzoyl peroxide (Aldrich), and 2.0 g of polyvinylphenol (Aldrich) having a weight-average molecular weight of 8,000 were dissolved in 18 ml of cyclohexanone to give a composition for forming an organic insulating film.

PREPARATIVE EXAMPLE 2

Preparation of Composition for Forming Organic Insulating Film Using Monomer Containing Radical-polymerizable Group as Functional Group 1.0 g of trimethylolpropane trimethacrylate (Aldrich), 0.01 g of triphenylsulfonium triflate (Aldrich), 0.01 g of benzoyl peroxide (Aldrich), and 3.0 g of polyvinylphenol (Aldrich) having a weight-average molecular weight of 8,000 were dissolved in 27 ml of cyclohexanone to give a composition for forming an organic insulating film.

COMPARATIVE PREPARATION EXAMPLE 1

Preparation of Composition for Forming Organic Insulating Film Without Using Any Functional Group-containing Monomer and Initiator 3.0 g of polyvinylphenol (Aldrich) having a weight-average molecular weight of 8,000 was dissolved in 27 ml of cyclohexanone to give a composition for forming an organic insulating film.

EXAMPLE 1

(1) Formation of Pattern of Organic Insulating Film

Figure 4:
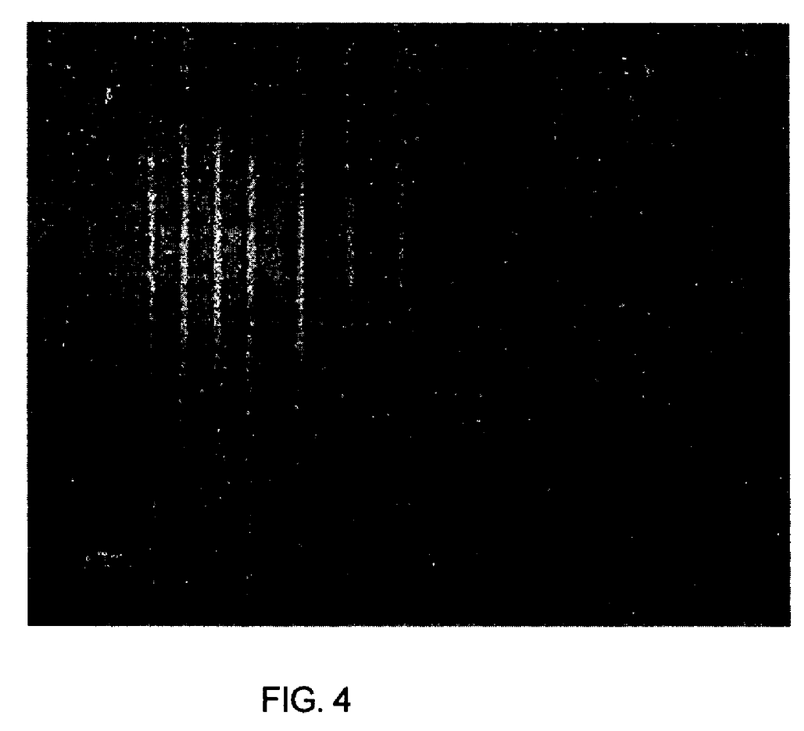
FIG. 4 is an electron micrograph showing a pattern of an organic insulating film formed in Example 1.

The composition for forming an organic insulating film prepared in Preparative Example 1 was spin-coated at 2,000 rpm on a glass substrate to form an 8,000 Å thick organic insulating film, and soft-baked at 100° C. for 5 minutes. Thereafter, the organic insulating film was irradiated with UV light (100 mJ/cm$^2$) in a UV exposure system through a photomask having a desired shape, and hard-baked at 100° C. for 10 minutes. Next, the exposed inorganic insulating film was developed using 1-methyl-2-pyrrolidone as an organic developing solution to remove the unexposed region, thereby forming the pattern of the organic insulating film shown in FIG. 4.

(2) Fabrication of Organic Thin Film Transistor

An 800 Å thick gate electrode was formed using molybdenum (Mo) on a glass substrate, and then a pattern of an organic insulating film on an electrode for connection to a driving circuit was formed in the same manner as in Example 1 (1).

500 Å thick source/drain Au electrodes were formed on the patterned organic insulating film through a shadow mask (channel length: 100 μm, channel width: 1 mm) by vacuum deposition, and then a pentacene organic semiconductor layer (thickness: 700 Å) was formed on the resulting structure by organic molecular beam deposition (OMBD) to fabricate an organic thin film transistor.

EXAMPLE 2

(1) Formation of Pattern of Organic Insulating Film

A pattern of an organic insulating film was formed in the same manner as in Example 1, except that the composition prepared in Preparative Example 2 was used.

(2) Fabrication of Organic Thin Film Transistor

An organic thin film transistor was fabricated in the same manner as in Example 1, except that the pattern formed in Example 2 (1) was used.

COMPARATIVE EXAMPLE 1

(1) Formation of Pattern of Organic Insulating Film

Pattern formation of an organic insulating film was conducted using the composition prepared in Comparative Preparation Example 1 according to the same procedure as in Example 1. However, a pattern was not successfully formed because the organic insulating film was non-selectively developed with the organic developing solution.

(2) Fabrication of Organic Thin Film Transistor

An organic thin film transistor was fabricated in the same manner as in Example 1, except that a pattern of an organic insulating film on an electrode for connection to a driving circuit was formed by a common photolithographic process.

Figure 5:
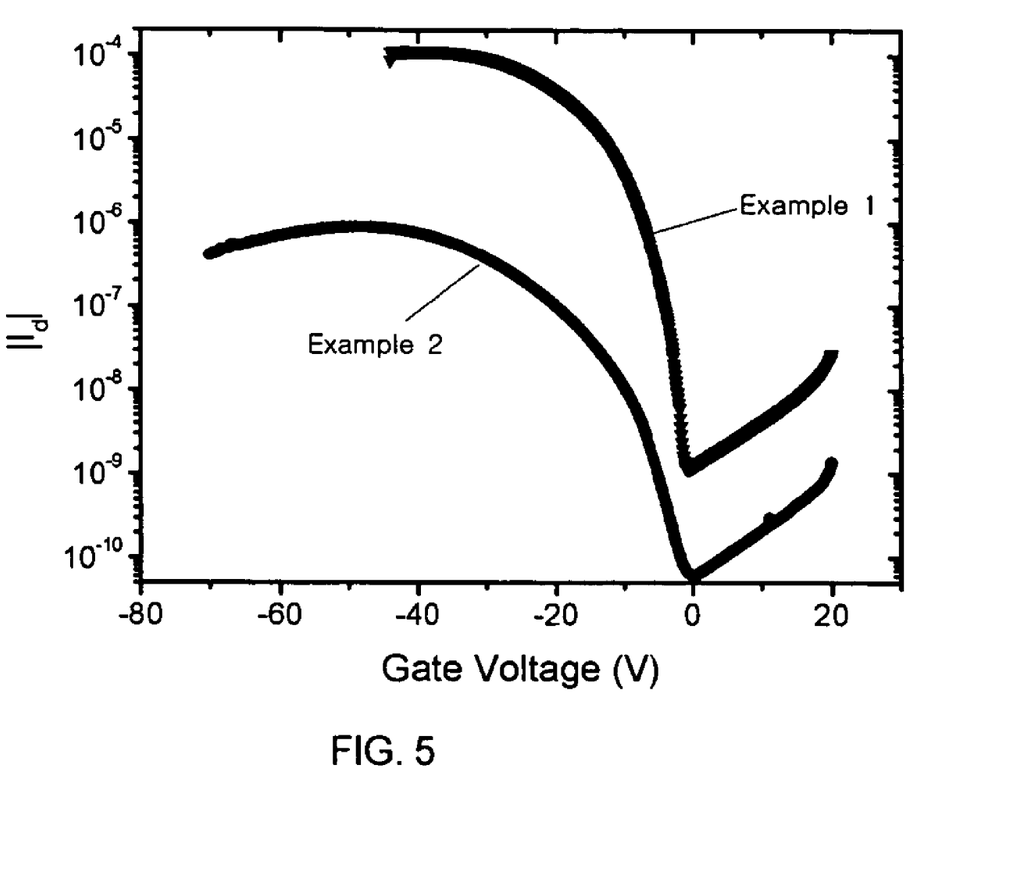
FIG. 5 is a graph showing the current transfer characteristics of organic thin film transistor fabricated in Examples 1 and 2.

The current transfer characteristics of the devices fabricated in Examples 1 and 2 and Comparative Example 1 were evaluated using a KEITHLEY semiconductor analyzer (4200-SCS). FIG. 5 shows curves showing the current transfer characteristics of the devices fabricated in Examples 1 and 2. The electrical properties of the devices were measured in accordance with the following methods. The obtained results are shown in Table 1. However, since the device fabricated in Comparative Example 1 was dissolved in solvents used in the photolithographic process, a normal curve showing the current transfer characteristics of the device could not be plotted.

The charge carrier mobility was calculated from the slope of a graph representing the relationship between $(I_{SD})^{1/2}$ and VG from the following current equations in the saturation region, which was obtained using each graph showing the current transfer characteristics of the devices:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$: source-drain current, $\mu$ and $\mu_{FET}$: charge carrier mobility, $C_o$: capacitance of the oxide film, W: channel width, L: channel length; $V_G$: gate voltage, and $V_T$: threshold voltage.

The off-state leakage current ($I_{off}$) is a current flowing in the off-state, and was determined from the minimum current in the off-state in the current ratio.

The on/off current ratio ($I_{on}/I_{off}$) was determined from a ratio of a maximum current in the on-state to a minimum current in the off-state.

TABLE 1

|  | Charge carrier mobility (cm$^2$/Vs) | Off-state leakage current ($I_{off}$) (A) | On/off current ratio ($I_{on}/I_{off}$) |
| --- | --- | --- | --- |
| Example 1 | 0.9 | $10^{-10}$ | $10^5$ |
| Example 2 | 1.3 | $10^{-11}$ | $10^5$ |

As can be seen from the data shown in Table 1, the organic thin film transistors fabricated in Examples 1 and 2 using the compositions of embodiments of the present invention showed high charge carrier mobility and high on/off current ratio while maintaining low off-state leakage current.

Although the embodiments of the present invention have been described herein with reference to the foregoing specific examples, these examples do not serve to limit the scope of the present invention. Accordingly, those skilled in the art will appreciate that various modifications and changes are possible, without departing from the technical spirit of the present invention.

As apparent from the above description, the use of the photo-patternable composition of embodiments of the present invention enables simple patterning of an organic insulating film and thus eliminates the need for a photoresist process. Therefore, according to embodiments of the present invention, organic thin film transistors having high charge carrier mobility can be fabricated by simplified procedure at low costs.

What is claimed is:

1. A composition for forming an organic insulating film, comprising:
   (i) a functional group-containing monomer, the monomer being a compound containing at least one epoxide group selected from those represented by the following Formula 1:

or a compound containing at least one radical-polymerizable group selected from those represented by the following Formula 2:

wherein
R is hydrogen or methyl;
(ii) an initiator generating an acid or a radical upon light irradiation; and
(iii) an organic or inorganic polymer,
wherein the organic or inorganic polymer is one having a molecular weight of between 1,000 and 1,000,000, and is selected from the group consisting of polyvinylphenols and their derivatives, polyvinylalcohols and their derivatives, polyacryls and their derivatives, polynorbornenes and their derivatives, polyethyleneglycol derivatives, polypropyleneglycol derivatives, polysiloxane derivatives, cellulose derivatives, and copolymers thereof, and
wherein the organic or inorganic polymer is protected with an acid-labile protecting group selected from the group consisting of t-butyl, isobornyl, menthyl, 2-methyl-2-adamantanyl, 2-ethyl-2-adamantanyl, tetracyclodecanyl, tetrahydropyranoyl, 3-oxocyclohexanoyl, mevalonic lactonyl, dicyclolpropylmethyl, methylcyclopropylmethyl, and methyl ethyl ether groups.

2. The composition according to claim 1, wherein the acid-generating initiator is selected from the group consisting of sulfonium-based ionic photoacid generators, iodonium-based ionic photoacid generators, nitrobenzylsulfonate and its derivatives -based non-ionic photoacid generators, nitrobenzylsulfonate and its derivatives -based non- ionic photoacid generators, imidosulfonate and its derivatives -based non-ionic photoacid generators, azonaphthoquinone and its derivatives -based non-ionic photoacid generators, and polymeric photoacid generators having a weight-average molecular weight of 500-100,000 and containing a sulfonium or iodonium salt in their backbone or side chain or an organic photoacid generating group in their side chain.

3. The composition according to claim 1, wherein the radical-generating initiator is selected from the group consisting of organic peroxide and azo compounds, alpha-hydroxyketones, alpha-aminoketones, benzyldimethyl ketals, benzoin, benzoin methyl ether, benzoin ethyl ether; benzoin n-propyl ether; benzoin isopropyl ether, benzoin n-butyl ether, benzophenone, paramethyl benzophenone, acetophenone, anthraquinone, phenyl disulfide, and 2-nitrofluorene.

4. The composition according to claim 3, wherein the organic peroxide and azo compounds are selected from the group consisting of benzoyl peroxide, lauroyl peroxide, t-butyl hydroperoxide, acetylcyclohexanesulfonyl peroxide, isobutyroyl peroxide, di(2-ethylhexyl) peroxydicarboxylate, dilsopropyl peroxydicarboxylate, t-butyl peroxypivalate, decanoyl peroxide, and azobis(2-methyipropionitrile).

5. The composition according to claim 1, wherein the organic or inorganic polymer contains hydroxyl or carboxyl groups in its backbone or side chain.

6. A composition for forming an organic insulating film, comprising:
(i) a functional group-containing monomer, the monomer being a compound containing at least one epoxide group selected from those represented by the following Formula 1:

or a compound containing at least one radical-polymerizable group selected from those represented by the following Formula 2:

wherein
R is hydrogen or methyl;
(ii) an initiator generating an acid or a radical upon light irradiation; and
(iii) an organic or inorganic polymer,
wherein the initiator is present in an amount of 0.1-10 parts by weight and the organic or inorganic polymer is present in an amount of 1-10,000 parts by weight, based on 100 parts by weight of the monomer.

7. The composition according to claim 1, further comprising 1%-80% by weight of a solvent selected from the group consisting of cyclohexanone, chloroform, chlorobenzene, ethylene glycol monomethyl ether, propylene glycol methyl ether acetate, ethyl lactate, toluene, xylene, methyl ethyl ketone, 4-heptanone, methanol, butanol, acetone, N-methylformamide, N-methylpyrrolldone, triphenylimidazole, mesitylene, tetraline and decaline, based on the total weight of the composition.

8. An organic thin film transistor comprising a substrate, a gate electrode, an organic insulating film, an organic semiconductor layer and source/drain electrodes wherein the organic insulating film is the organic insulating film patterned by a method comprising:
forming an electrode on a substrate;
coating a composition according to claim 1 thereon to form an organic insulating film;
exposing the organic insulating film to light through a photomask having a desired pattern; and
developing with an organic developing solution,
wherein the organic semiconductor layer is made of a material selected from the group consisting of pentacenes, copper phthalocyanines, polythiophenes, polyanilines, polyacetylenes, polypyrroles, polyphenylene vinylenes, and derivatives thereof.

9. An organic thin film transistor comprising a substrate, a gate electrode, an organic insulating film, an organic semiconductor layer and source/drain electrodes wherein the organic insulating film is the organic insulating film patterned by a method comprising:
forming an electrode on a substrate;
coating a composition according to claim 1 thereon to form an organic insulating film;
exposing the organic insulating film to light through a photomask having a desired pattern; and
developing with an organic developing solution,
wherein the gate electrode, the source electrode and the drain electrode are made of a material selected from the group consisting of gold, silver, aluminum, nickel, molybdenum, tungsten, indium-tin oxides, polythiophenes, polyanilines, polyacetylenes, polypyrroles, polyphenylene vinylenes, and polyethylenedioxythiophene/polystyrenesulfonate mixtures.

10. The organic thin film transistor according to claim 8, wherein the substrate is made of a material selected from the group consisting of glass, silicon, and plastic.

11. A display device comprising the organic thin film transistor according to claim 8.

12. The organic thin film transistor according to claim 9, wherein the substrate is made of a material selected from the group consisting of glass, silicon, and plastic.

13. A display device comprising the organic thin film transistor according to claim 9.

14. The organic thin film transistor according to claim 8, wherein the coating is carried out by a coating process selected from the group consisting of spin coating, spin casting, dip coating, spray coating, roll coating, and ink-jet printing.

15. The organic thin film transistor according to claim 8, wherein the exposure to light is carried out by irradiating the surface of the organic insulating film with UV light at an exposure dose of 1 to 400 mJ/cm$^2$ in a UV exposure system, and the exposed organic insulating film is hard-baked at 80-150° C. for 1-120 minutes.

16. An organic insulating film formed with the composition according to claim 1.

17. The organic thin film transistor according to claim 9, wherein the coating is carried out by a coating process selected from the group consisting of spin coating, spin casting, dip coating, spray coating, roll coating, and ink-jet printing.

18. The organic thin film transistor according to claim 9, wherein the exposure to light is carried out by irradiating the surface of the organic insulating film with UV light at an exposure dose of 1 to 400 mJ/cm$^2$ in a UV exposure system, and the exposed organic insulating film is hard-baked at 80-150° C. for 1-120 minutes.

19. An organic insulating film formed with the composition according to claim 6.

* * * * *